United States Patent
Shen

(10) Patent No.: US 10,827,641 B1
(45) Date of Patent: Nov. 3, 2020

(54) SERVER APPARATUS WITH HORIZONTAL PUSH-PULL OPERATING STRUCTURE

(71) Applicant: Super Micro Computer Inc., San Jose, CA (US)

(72) Inventor: William Shen, San Jose, CA (US)

(73) Assignee: Super Micro Computer Inc., San Jose, CA (US)

( * ) Notice: Subject to any disclaimer, the term of this patent is extended or adjusted under 35 U.S.C. 154(b) by 0 days.

(21) Appl. No.: 16/668,585

(22) Filed: Oct. 30, 2019

(51) Int. Cl.
 *H05K 7/14* (2006.01)
 *H05K 7/20* (2006.01)
 *A47B 88/497* (2017.01)
 *A47B 88/483* (2017.01)
 *A47B 88/477* (2017.01)

(52) U.S. Cl.
 CPC ....... *H05K 7/1489* (2013.01); *H05K 7/20709* (2013.01); *A47B 88/477* (2017.01); *A47B 88/483* (2017.01); *A47B 88/497* (2017.01)

(58) Field of Classification Search
 CPC ............ H05K 7/1489; H05K 7/20709; H05K 7/20727; A47B 88/497; A47B 88/477; A47B 88/483
 See application file for complete search history.

(56) References Cited

U.S. PATENT DOCUMENTS

| | | | | |
|---|---|---|---|---|
| 5,518,412 A | * | 5/1996 | Larabell | H01R 13/62938 439/153 |
| 5,721,669 A | * | 2/1998 | Becker | G11B 33/124 361/679.31 |
| 7,108,524 B2 | * | 9/2006 | Wahler | G06K 13/08 439/159 |
| 10,537,040 B1 | * | 1/2020 | Yeh | G06F 1/181 |
| 2009/0257186 A1 | * | 10/2009 | Dunham | G06F 1/187 361/679.33 |
| 2011/0279973 A1 | * | 11/2011 | Terwilliger | H05K 7/1489 361/679.58 |
| 2012/0242203 A1 | * | 9/2012 | Gong | G06F 1/187 312/223.2 |
| 2013/0087518 A1 | * | 4/2013 | He | H05K 7/1489 211/26 |
| 2013/0107424 A1 | * | 5/2013 | Thomas | H05K 7/1411 361/679.01 |
| 2019/0075666 A1 | * | 3/2019 | Ehlen | H05K 5/0239 |
| 2020/0100381 A1 | * | 3/2020 | Liu | H05K 7/1409 |
| 2020/0112774 A1 | * | 4/2020 | Lee | H04Q 1/025 |

* cited by examiner

*Primary Examiner* — Daniel J Rohrhoff
(74) *Attorney, Agent, or Firm* — Chun-Ming Shih; HDLS IPR Services

(57) ABSTRACT

A server apparatus with a horizontal push-pull operating structure includes a chassis having a base plate and chassis plates with guiding slots; a carrying tray on the base plate and inserted into the chassis plates, the carrying tray having carrying board and side boards having sliding slots formed corresponding to the guiding slots; and an operating structure having a moving arm with a gear rack thereon and a gear sector clamped between the moving arm and the side board and having an addendum engaged with the gear rack and a sliding column inserted into the sliding and guiding slots. When the moving arm is horizontally pushed/pulled relative to the side boards, the gear rack drives the gear sector to rotate, and the sliding column moves inside the sliding slot and drives the carrying tray to move in/out of the base plate respectively under guidance of the guiding slot.

10 Claims, 14 Drawing Sheets

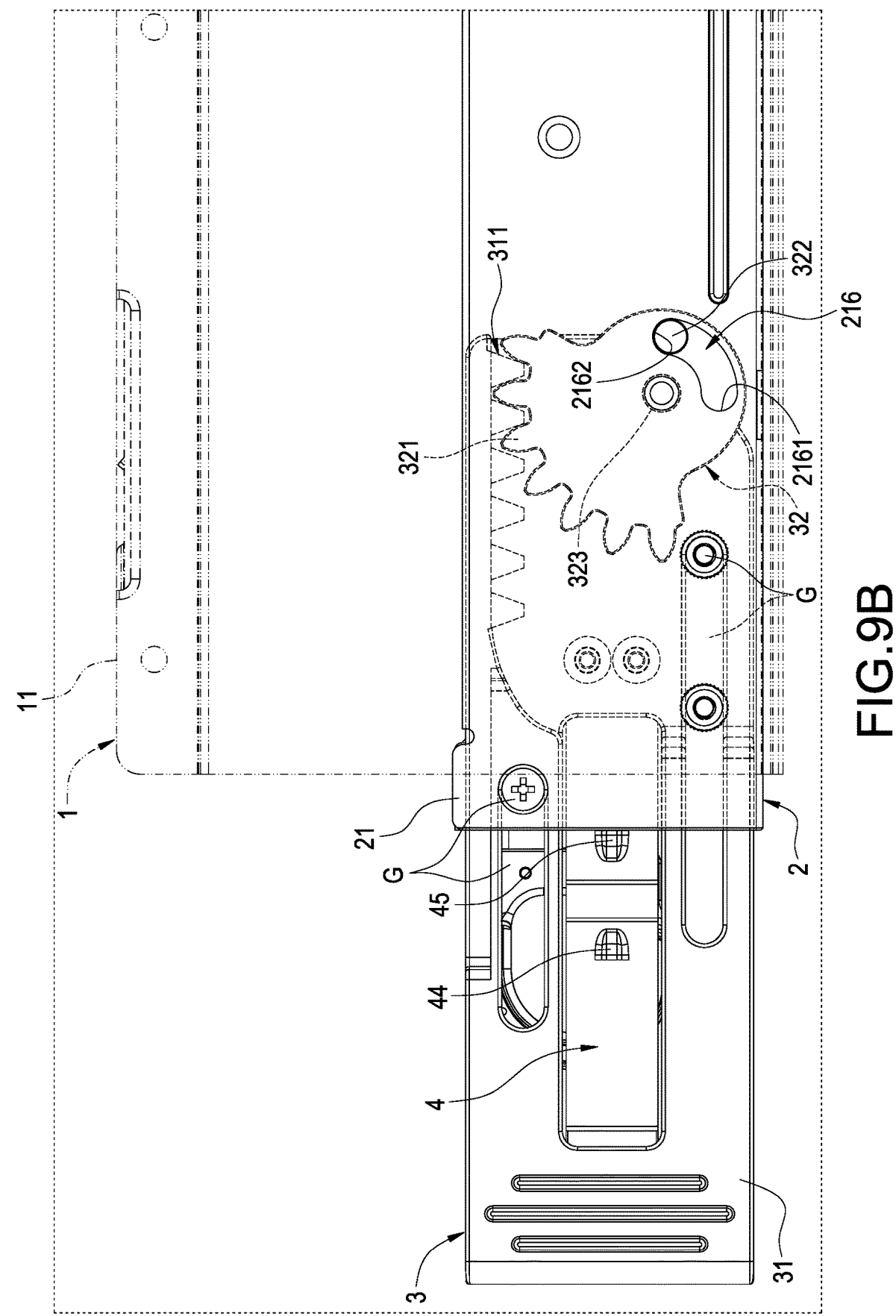

SERVER APPARATUS WITH HORIZONTAL PUSH-PULL OPERATING STRUCTURE

BACKGROUND OF THE INVENTION

Field of the Invention

The technical field relates to a server, in particular, to a server apparatus with a horizontal push-pull operating structure.

Description of Related Art

A server system mainly refers to an electronic device having a mainboard installed inside a chassis, a carrying unit for carrying the mainboard and a hard disk, and a power supply etc. In addition, the internal of the chassis is mostly partitioned into a plurality of insertion space for accommodating a plurality of carrying units arranged in an array.

To provide electrical connection between the carrying unit and the chassis, the carrying unit and the chassis are respectively installed with connectors capable of attachment with each other (hereinafter collectively referred to as the "connector assembly").

Nevertheless, the data transmission volume handled by servers nowadays continues to increase such that the connector assembly used also increases in size accordingly, causing greater difficulty in the engagement and disengagement of connector assembly. Consequently, users are often required to exert an extremely great force to engage or disengage the connector assembly. As a result, there is a need for the design of a structure capable of achieving the labor-saving effect.

SUMMARY OF THE INVENTION

An objective of the present invention is to provide a server apparatus with a horizontal push-pull operating structure, such that through the operating structure, it is able to generate a special design of a horizontal push-pull type labor-saving lever in order to achieve the labor-saving effect. Furthermore, the present invention is also able to achieve the effect of being applicable to at least 2U type of servers.

To achieve the aforementioned objective, the present invention provides a server apparatus with a horizontal push-pull operating structure, comprising: a chassis comprising a base plate and a first chassis plate and a second chassis plate arranged spaced apart from each other and installed vertically on the base plate, and the first plate having a guiding slot formed thereon; a carrying tray carried on the base plate and inserted between the first chassis plate and the second chassis plate, the carrying tray comprising a carrying board and a first side board and a second side board arranged spaced apart from each other and installed vertically on the carrying board, the first side board attached onto the first chassis plate and having a sliding slot formed corresponding to the guiding slot; and an operating structure comprising a moving arm and a gear sector, the moving arm attached onto the first side board and having a gear rack, the gear sector clamped between the moving arm and the first side board and having an addendum and a sliding column, the gear sector pivotally attached onto the first side board, the addendum engaged with the gear rack, the sliding column inserted into the sliding slot and the guiding slot; wherein when the moving arm together with the gear rack are horizontally pushed or pulled relative to the first side board selectively, the gear rack drives the gear sector to rotate, and the sliding column moves inside the sliding slot along with the gear sector and also drives the first side board to move due to guidance provided by the guiding slot, and respectively allowing the carrying tray to move into the base plate or move out of the base plate.

In comparison to the prior arts, the present invention is able to achieve the following effects: the present invention is able to utilize the gear tack in conjunction with the gear sector to generate a horizontal push-pull labor-saving lever in order to achieve the labor-saving effect. Furthermore, the present invention is able to achieve the effect of being applicable to at least 2U type servers.

BRIEF DESCRIPTION OF DRAWING

FIGS. 9A and 9B are side views of the present invention shown in FIG. 8.

DETAILED DESCRIPTION OF THE INVENTION

The following provides a detailed technical content of the present invention along with the accompanied drawings. However, the accompanied drawings are provided for reference and illustrative purpose only such that they shall not be used to limit the scope of the present invention.

Figure 4:
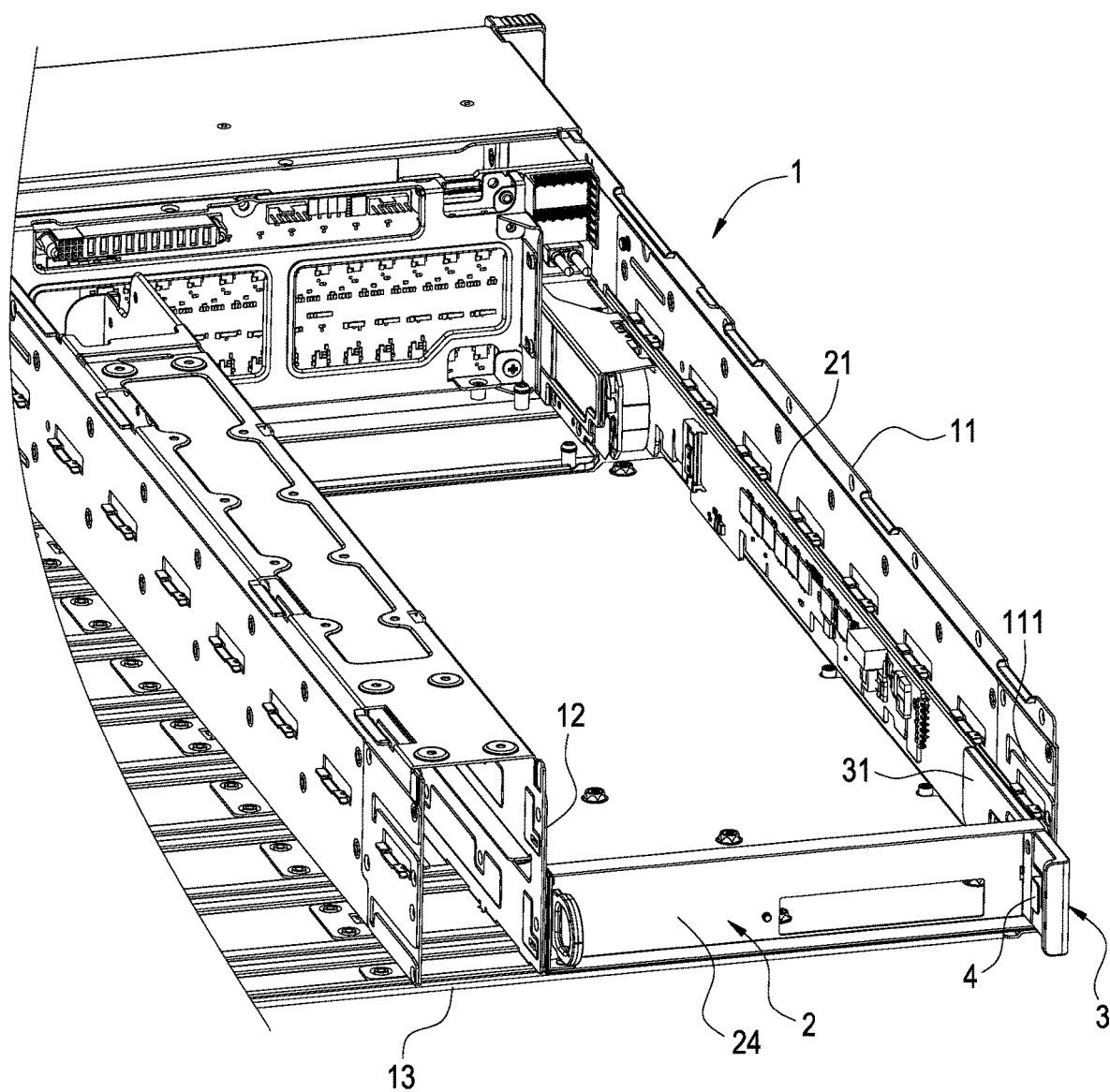
FIG. 4 is a perspective assembly view according to the first exemplary embodiment of the present invention.

As shown in FIG. 4, the present invention provides a server apparatus with a horizontal push-pull operating structure, comprising a chassis 1, at least one carrying tray 2 and at least one operating structure 3, preferably comprising at least one elastic retainer 4. The carrying tray 2 is used for carrying a mainboard and a plurality of hard disks not shown in the drawings. The operating structure 3 is arranged on the carrying tray 2, and by applying a force thereon, it is able to control the horizontal movement of the carrying tray 2 relative to the chassis 1. The present invention utilizes a manual method to operate the operating structure 3 in order to perform the operating actions of horizontal push or horizontal pull (push and pull are collectively referred to as "push-pull") in order to utilize the labor-saving lever principle to allow the carrying tray 2 to be moved in and moved out relative to the chassis 1 in a labor-saving manner.

As shown in FIG. 1 to FIG. 9, according to a first exemplary embodiment of the present invention, the chassis 1 shown in the drawings comprises two insertion spaces (not labeled with component signs) arranged vertically with each other, such that it is able to accommodate two carrying trays 2. Nevertheless, for the purpose of concise description, in the first exemplary embodiment, only one carrying tray 2 is used as an example for illustration. For a second exemplary embodiment of the present invention shown in FIG. 10, despite that chassis 1 comprises four insertion spaces arranged in parallel with each other in both vertical and horizontal directions such that four carrying trays 2 can be accommodated therein. Nevertheless, for the purpose of concise description, in the second exemplary embodiment, on the two insertion spaces arranged in the horizontal direction and two carrying trays 2 are used as an example for illustration.

Figure 1:
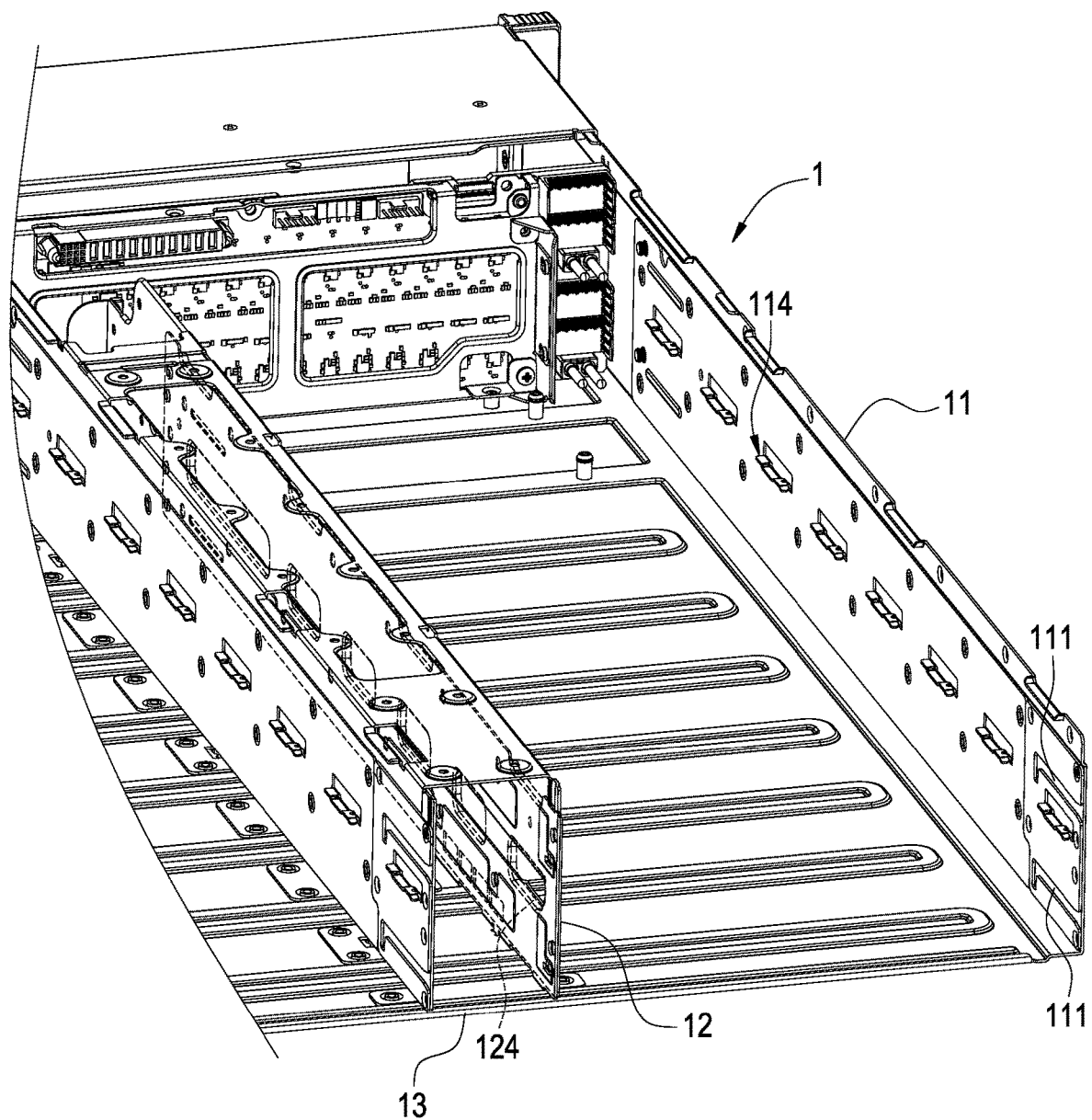
FIG. 1 is a partial perspective view of the chassis according to the first exemplary embodiment of the present invention.

As shown in FIG. 1, chassis 1 comprises a base plate 13 and a first chassis plate 11 and a second chassis plate 12 arranged spaced apart from each other and installed vertically on the base plate 13, and the first plate 11 includes a guiding slot 111 formed thereon. To be more specific, the first chassis plate 11 comprises a first chassis main body and a guiding sheet (both not labeled with the component signs), and the guiding sheet is attached at the inner surface of the first chassis main body and is formed of a guiding slot 111.

Figure 2A:
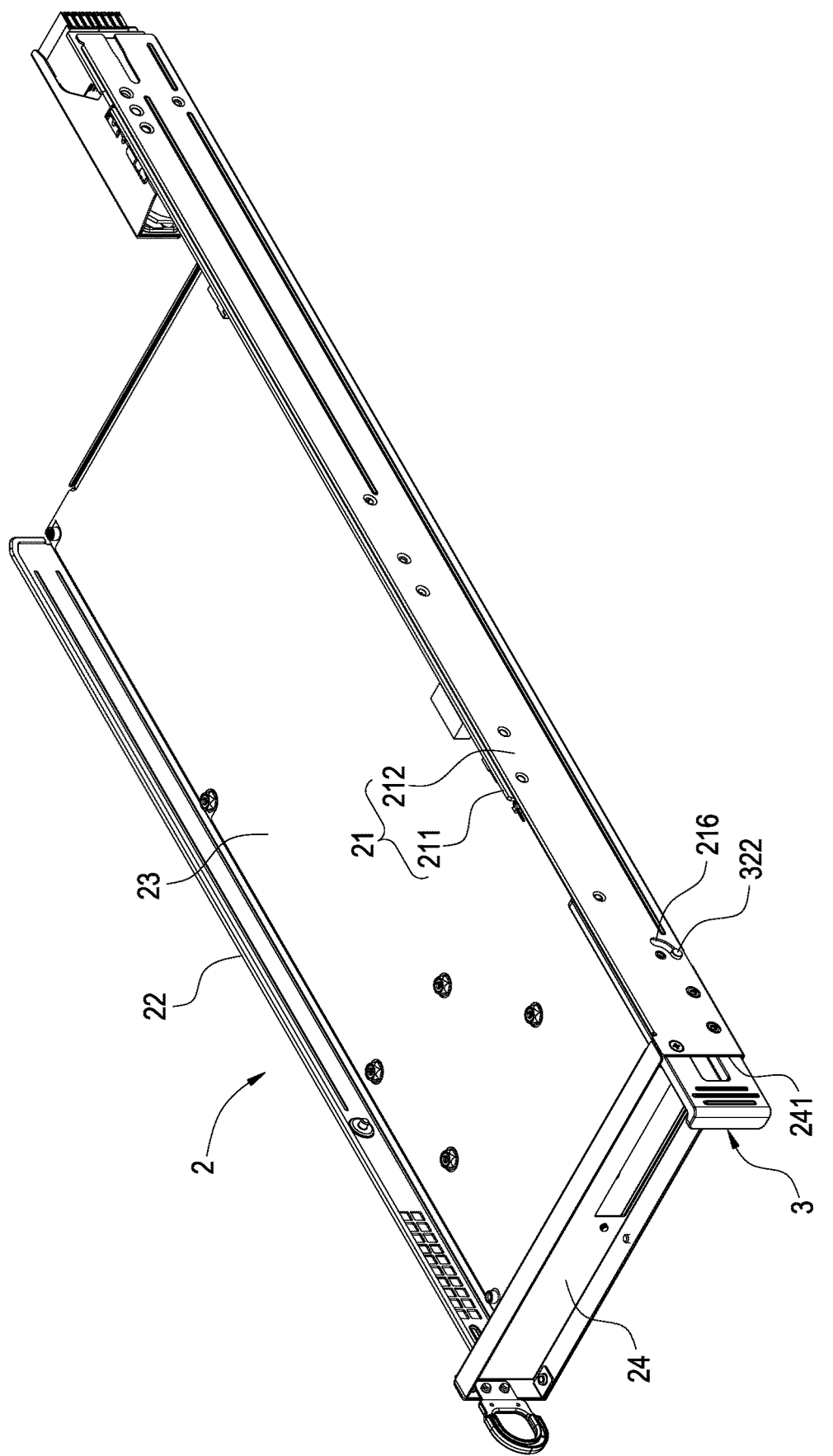
FIGS. 2A and 2B are perspective views of the carrying tray according to the first exemplary embodiment of the present invention (already installed with the operating structure)
Figure 2B:
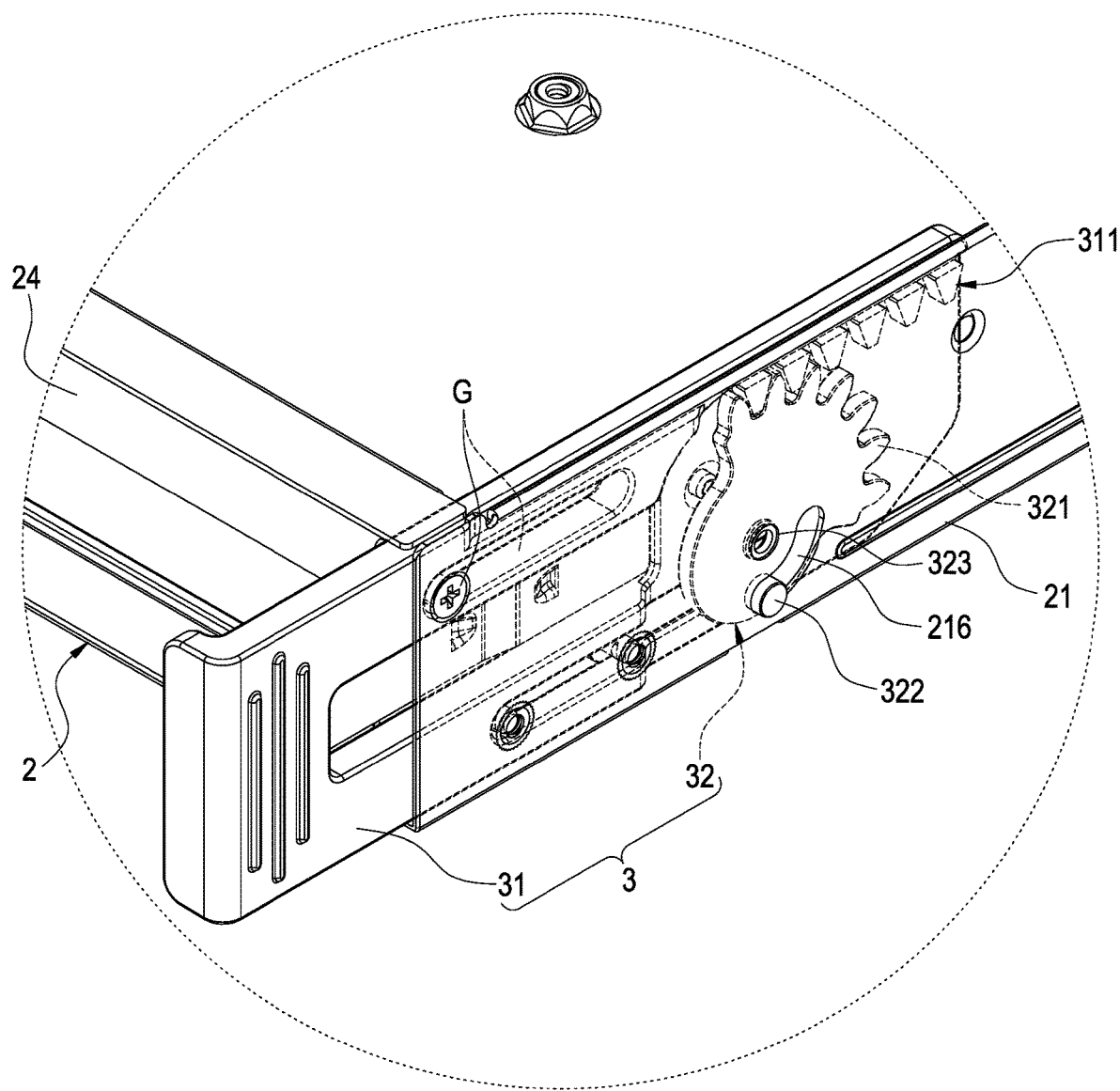
Figure 6A:
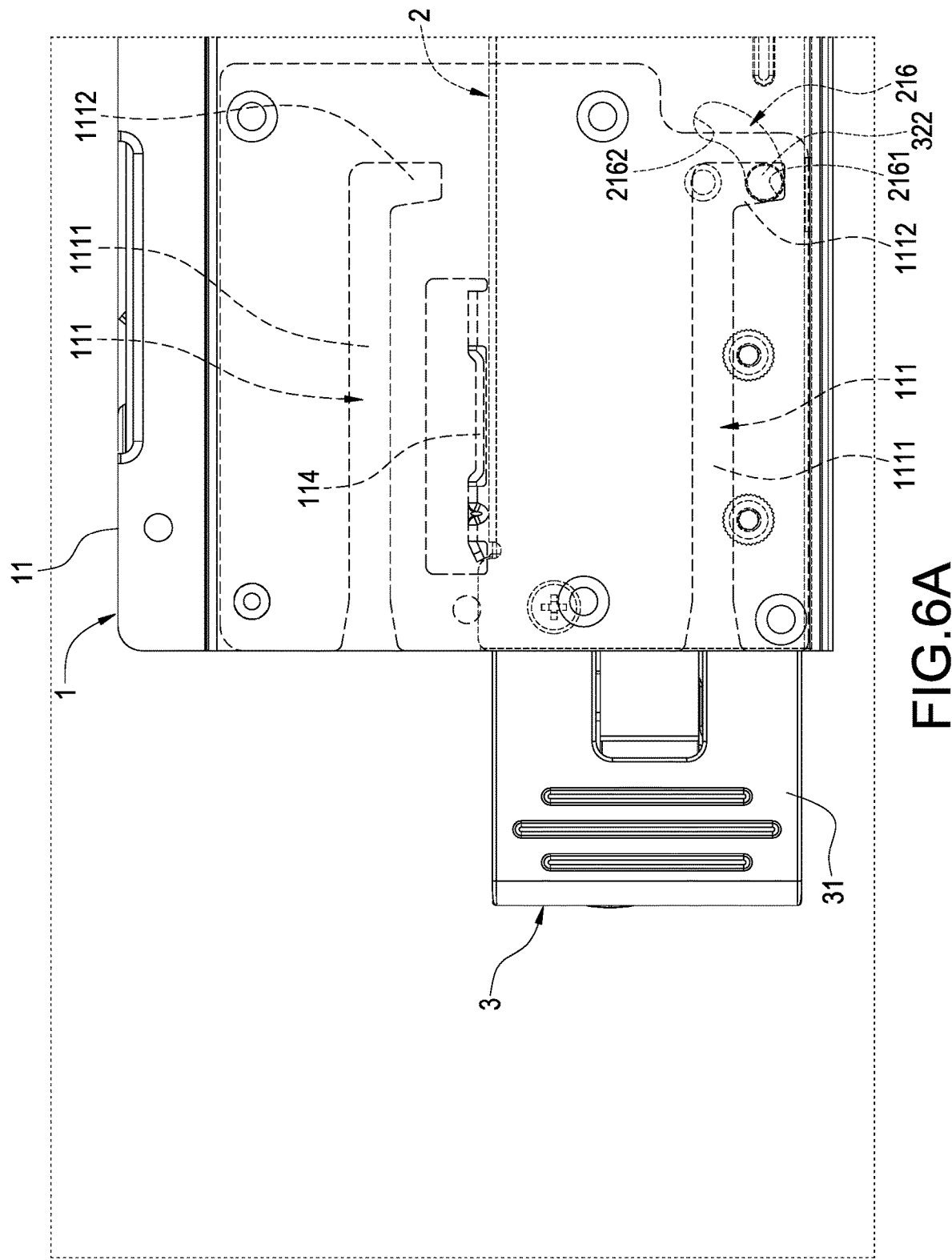
FIGS. 6A and 6B are side views of the present invention shown in FIG. 5.

As shown in FIG. 2A, FIG. 2B and FIG. 4, the carrying tray 2 is carried on the base plate 13 and inserted between the first chassis plate 11 and the second chassis plate 12. The carrying tray 2 comprises a carrying board 23 for the installation of a mainboard (not shown in the drawings) and a first side board 21 and a second side board 22 arranged spaced apart from each other and installed vertically on the carrying board 23. To be more specific, the carrying tray 2 further comprises a heat dissipating board 24, and the heat dissipating board 24 is connected between the first side board 21 and the second side board 222 and jointly circumferencing the carrying board 23. The first side board 21 is attached onto the first chassis plate 11, and the first side board 21 further includes a sliding slot 216 formed corresponding to the guiding slot 111 (as shown in FIG. 6A).

Figure 7:
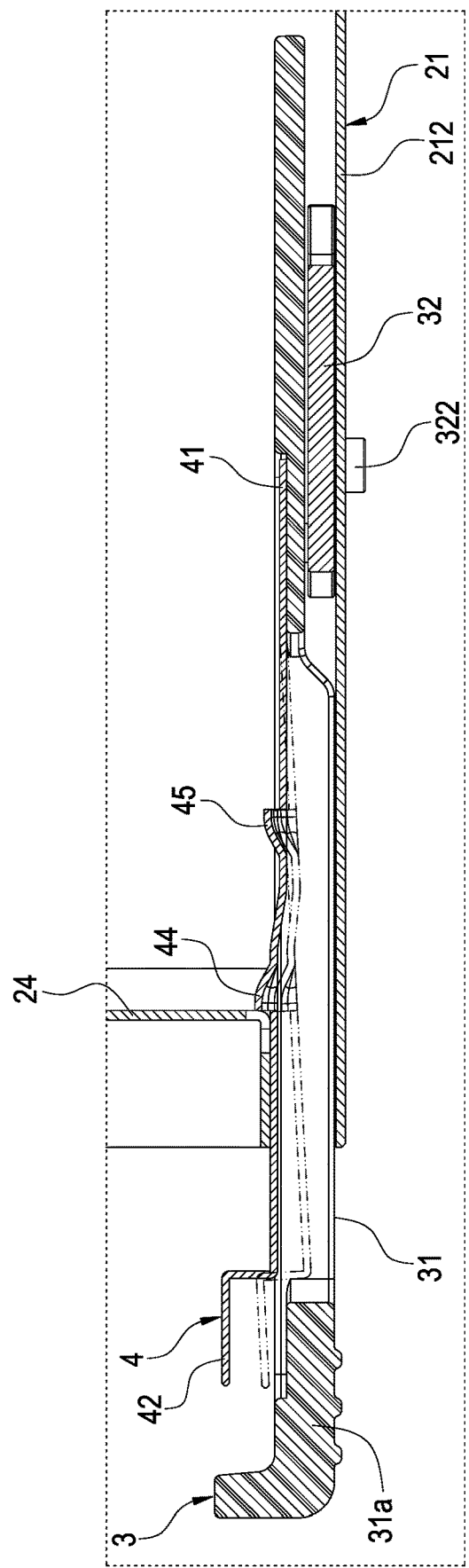
FIG. 7 is a cross sectional view of the present invention shown in FIG. 5 as viewed from the top (chassis omitted)

As shown in FIG. 2A, FIG. 2B, FIG. 3A, FIG. 3B and FIG. 4, the operating structure 3 comprises a moving arm 31 and a gear sector 32. The moving arm 31 is attached onto the first side board 21 and includes a gear rack. The gear sector 32 is clamped between the moving arm 31 and the first side board 21 (as shown in FIG. 7). In addition, the gear sector 32 includes an addendum 321 and a sliding column 32. The gear sector 32 is pivotally attached onto the first side board 21 (as shown in FIG. 2B), and the addendum 321 is engaged with the gear rack 311. Furthermore, the sliding column 322 is inserted into the sliding slot 216 and the guiding slot 111 as shown in FIG. 6A. Moreover, before the carrying ray 2 is not yet accommodated in the insertion space, the sliding column 322 protrudes out of the first side board 21 via the sliding slot 216 (as shown in FIG. 2). Once it is accommodated therein, the protruding portion of the sliding column 322 is then able to be inserted into the guiding slot 111.

Figure 3A:
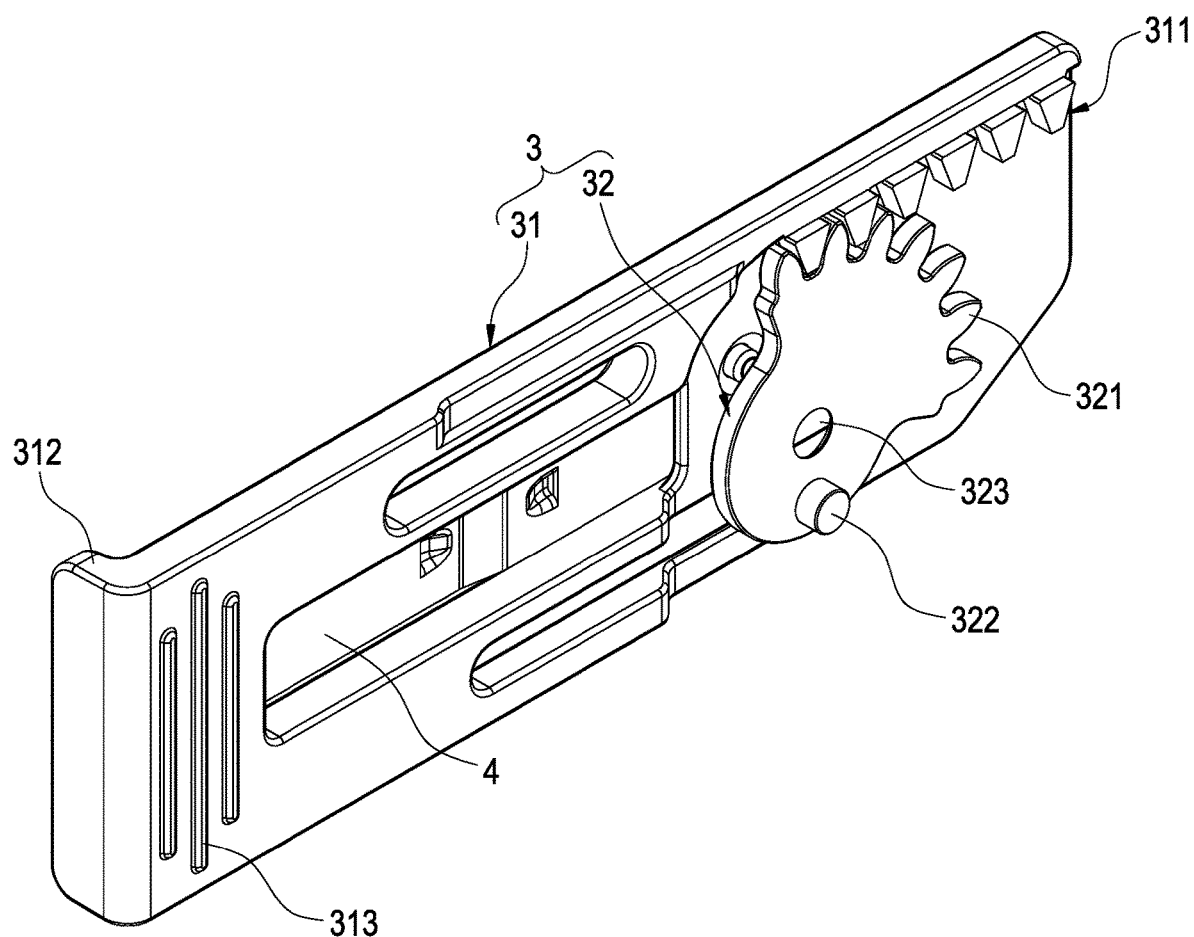
FIGS. 3A and 3B are perspective views of the operating structure according to the first exemplary embodiment of the present invention.
Figure 6B:
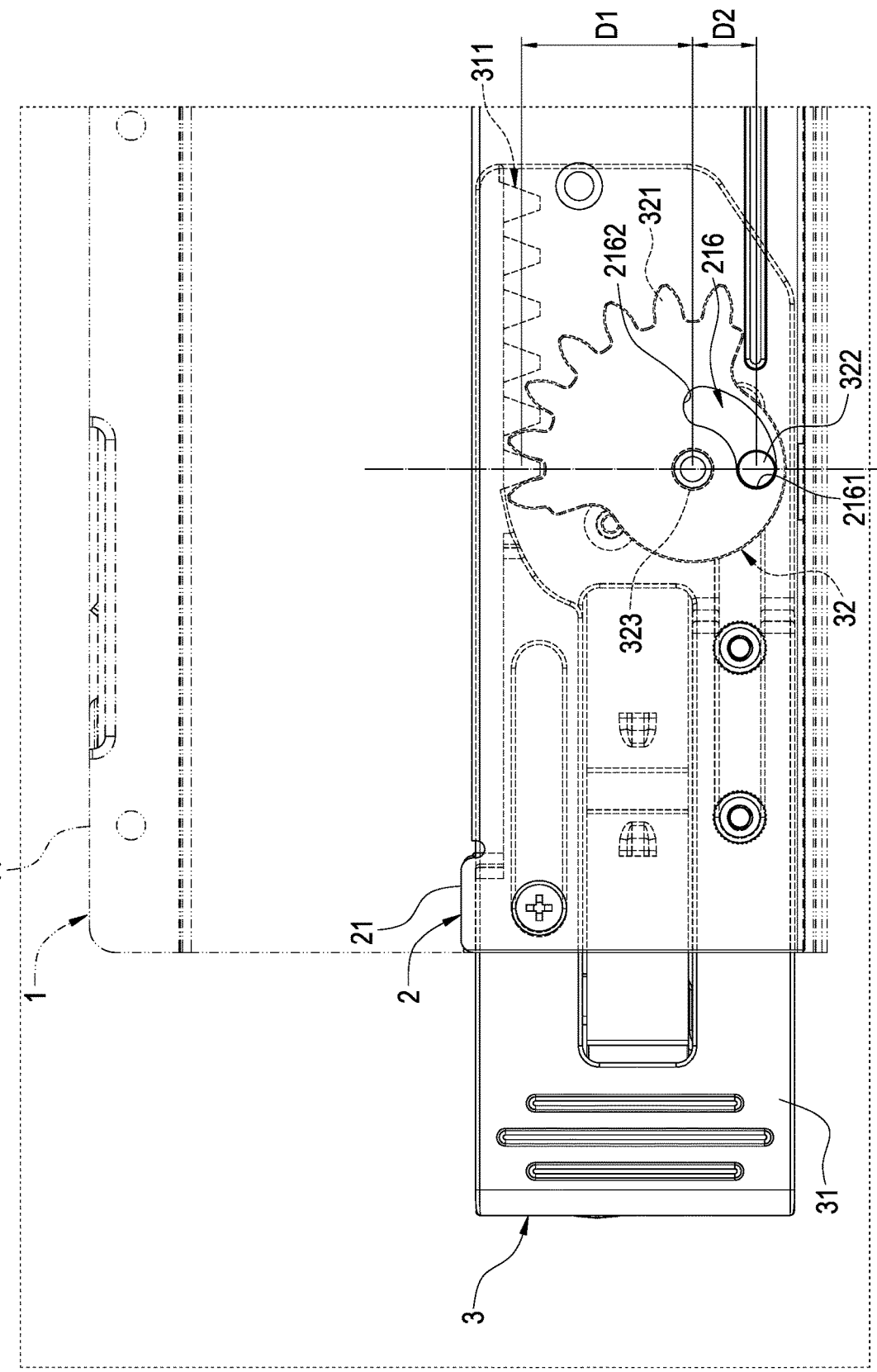

As shown in FIG. 6B and FIG. 3A, it shall be noted that the pivotal attachment area (such as the pivotal hole 323 formed on the gear sector 32) of the gear sector 32 is located between the addendum 321 and the sliding column 32. In addition, a first distance D1 between the addendum 321 and the pivotal attachment area (pivotal hole 323) is greater than a second distance D2 between the pivotal area (pivotal hole 323) and the sliding slot 322. In other words, the first distance D1 of the manual operation is greater than the second distance D2 of the driving movement of the sliding column 322. Consequently, a greater leverage can be obtained in order to allow the operating structure 3 to generate a horizontal push-pull labor-saving lever. Accordingly, such labor-saving lever can be used to engage and disengage the connector assembly (not shown in the drawings) between the chassis 1 and the carrying tray 2.

In view of the above, as shown in FIG. 6, when manual operation is performed to horizontally push the moving arm 31 together with the gear rack 311 to move inward from the external relative to the first side board 21, the gear rack 311 is able to drive the gear sector 32 to rotate in its original position, thereby causing the addendum 321 to deflect inward from the external along with the rotating action of the gear sector 32, and also causing the sliding column 32 to move inside the sliding slot 216 in an outward direction from the internal along with the rotating action of the gear sector 32. Furthermore, during the process of movement, due to the guidance provided by the guiding slot 111, the movement of the sliding column 322 under the guidance is able to drive the first side board 21 to move into the base plate 13. In other words, the entire carrying tray 2 is driven to move into the chassis 1.

Figure 9A:
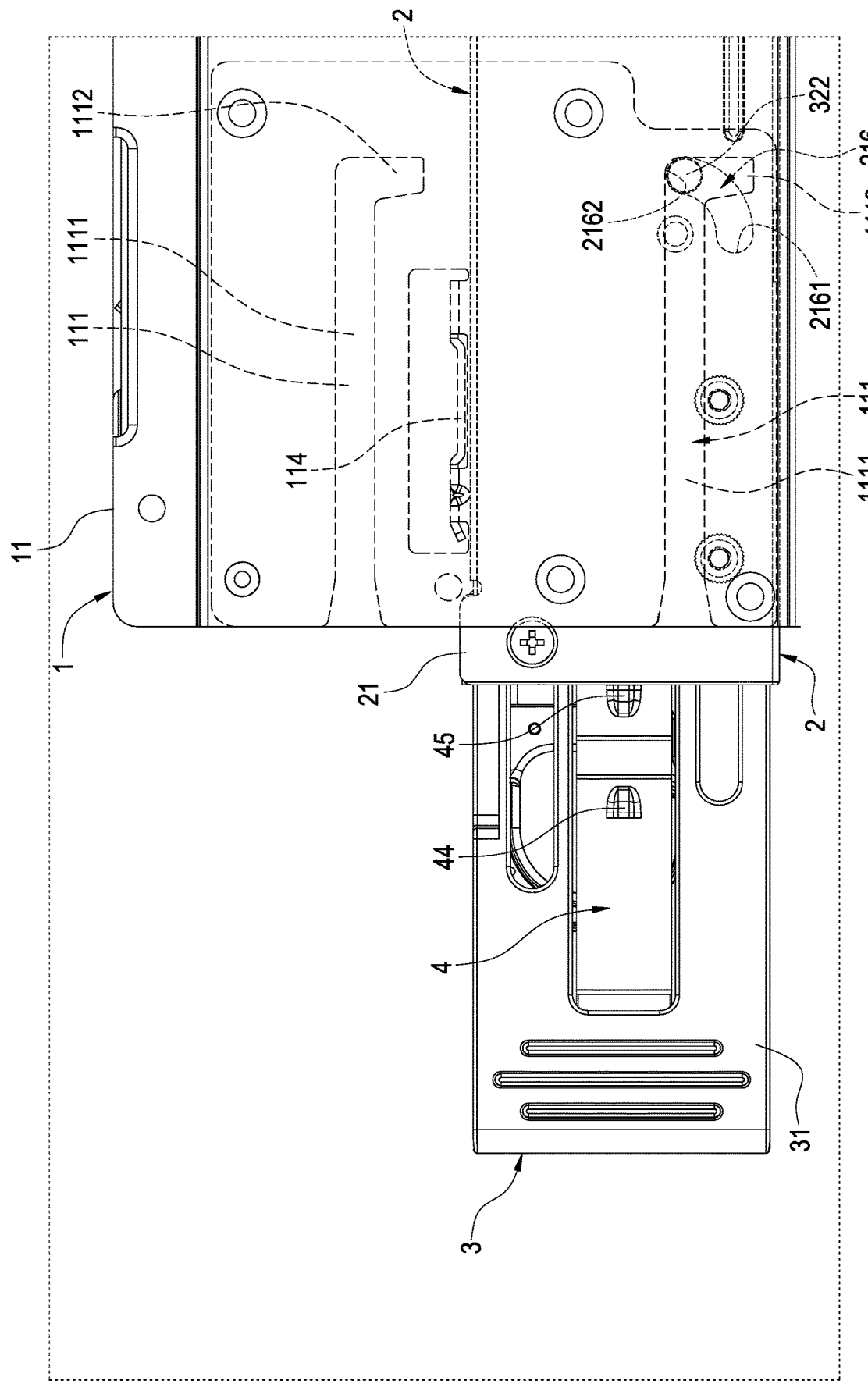

As shown in FIG. 9A and FIG. 9B, on the contrary, when manual operation is performed to horizontally pull the moving arm 31 together with the gear rack 311 to move outward form the internal relative to the first side board 21, the gear rack 311 is able to drive the gear sector 32 to rotate in its original position, thereby causing the addendum 321 to deflect outward from the internal along with the rotating action of the gear sector 32, and also causing the sliding column 32 to move inside the sliding slot 216 in an inward direction from the external along with the rotating action of the gear sector 32. Furthermore, during the process of movement, due to the guidance provided by the guiding slot 111, the movement of the sliding column 322 under the guidance is able to drive the first side board 21 to move out of the base plate 13. In other words, the entire carrying tray 2 is driven to move out of the chassis 1.

Figure 5:
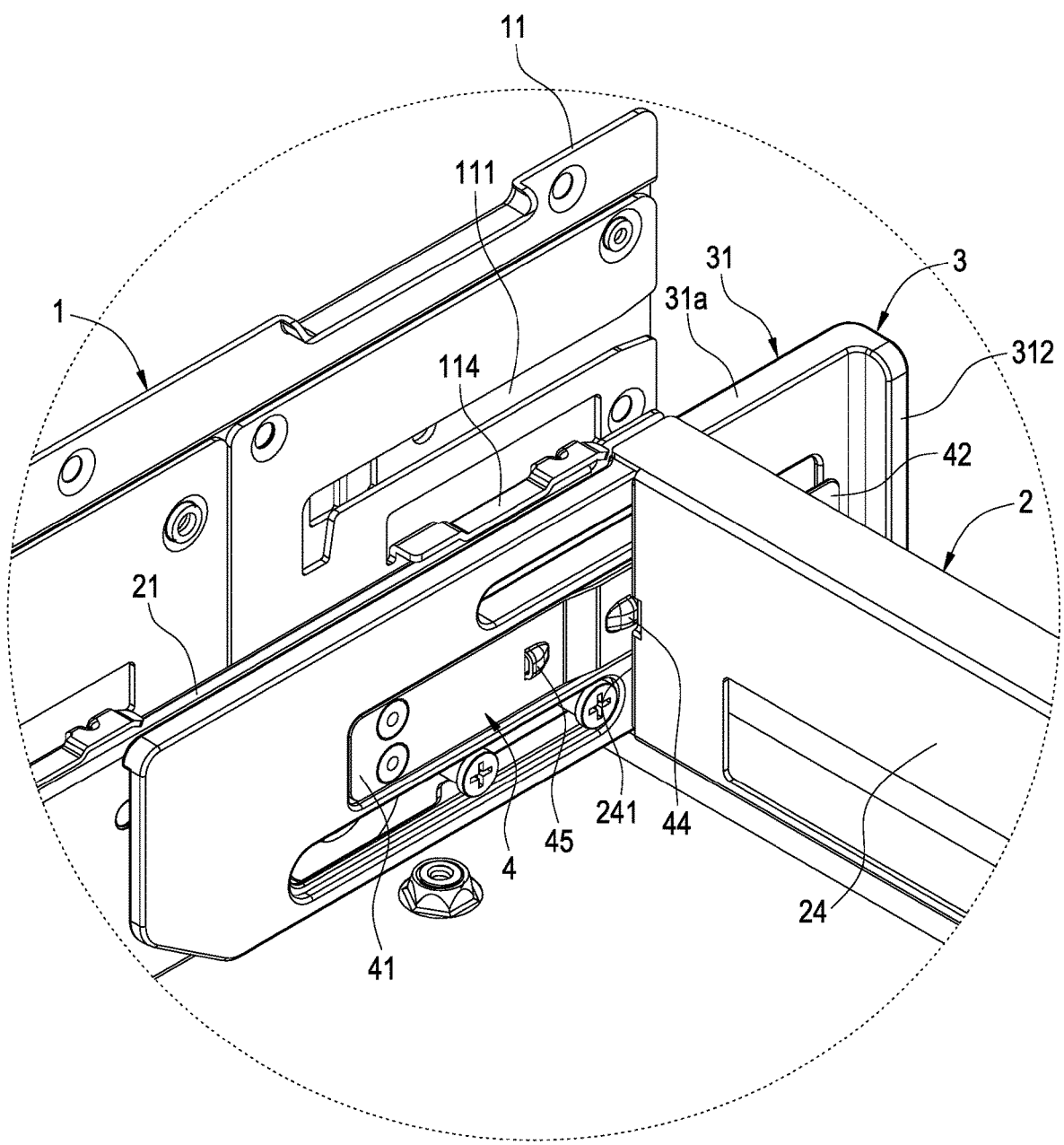
FIG. 5 is a partial enlarged view according to the first exemplary embodiment of the present invention after assembly.

To be more specific, as shown in FIG. 5 and FIG. 7, one end of the moving arm 31 protrudes out of the carrying tray 2 to form a holding section 31a. In addition, regardless whether the moving arm 31 is under the push-in state (as shown in FIG. 6) or the pull-out state (as shown in FIG. 9), the holding section 31a always protrudes out of the carrying tray 2 in order to facilitate the manual operation. Furthermore, as shown in FIG. 3, to facilitate the user's grabbing onto the moving arm 31, the external exposure end of the moving arm 31 forms a hook portion 312. To increase the friction for user's grabbing onto the moving arm 31, one side of the holding section 31a can be formed of an anti-skip pattern 313 in the forms of dots, strips or patterns.

As shown in FIG. 6 and FIG. 9, the sliding slot 216 can be a curved slot, and the guiding slot 111 can be an L-shaped slot. In addition, the sliding slot 216 includes a first end 2161 adjacent to the base plate 13 and a second end 2162 opposite therefrom. The guiding slot 111 includes a horizontal section 1111 and a vertical section 1112, and the vertical section 1112 is stacked onto the first end 2161 of the sliding slot 216.

As shown in FIG. 3, FIG. 4 and FIG. 5, the elastic retainer 4 is used for limiting the operating structure 3 to be maintained under the push-in state or pull-out state. It shall be noted that the carrying tray 2 includes an insertion slit 241. To be more specific, the insertion slit 241 is formed at an attachment area between the heat dissipating board 24 and the first side board 21, and the moving arm 31 is movably inserted into the insertion slit 241.

Figure 8:
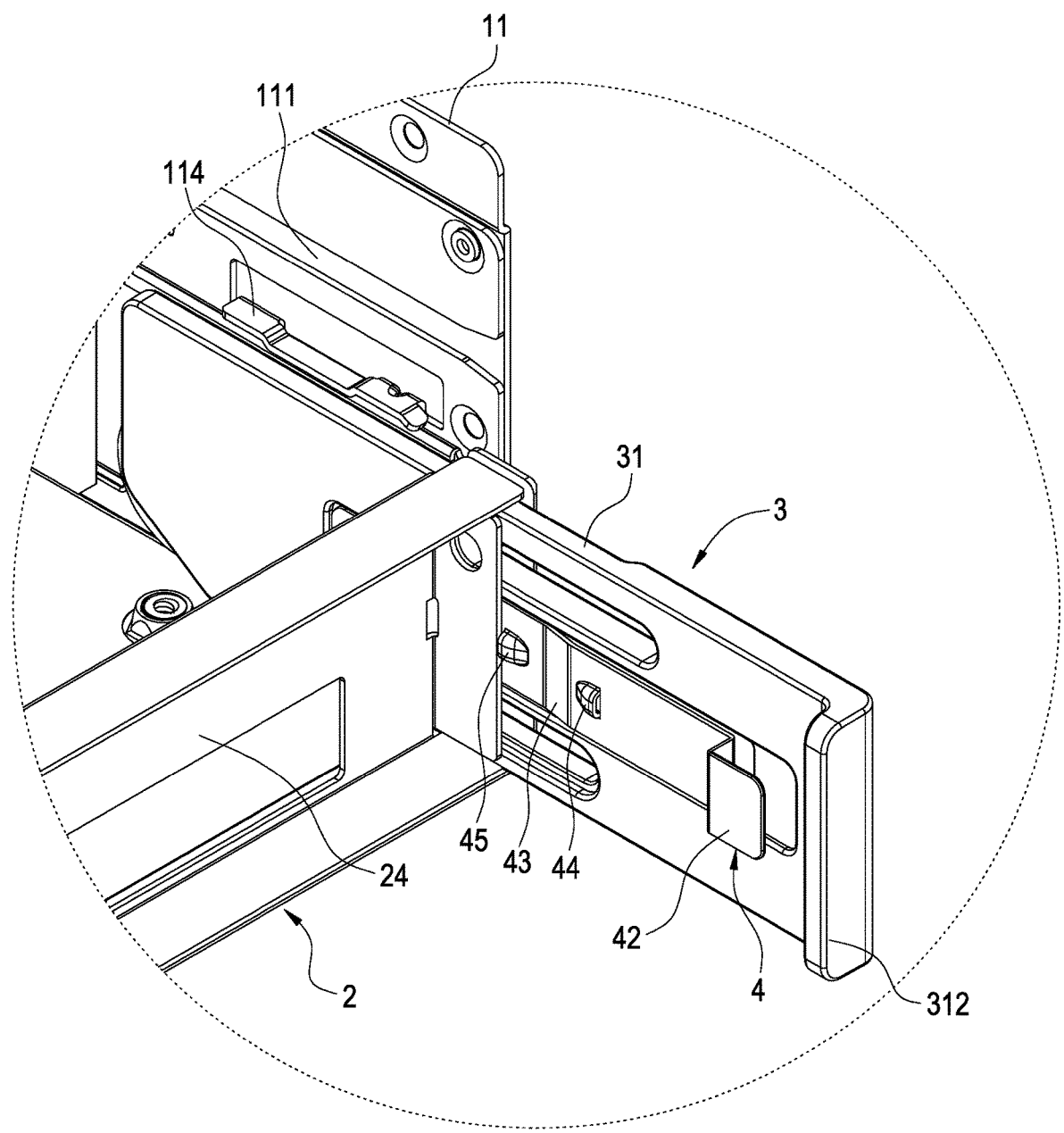
FIG. 8 is a partial enlarged view according to the first exemplary embodiment of the present invention with the carrying tray being pushed outward by a certain distance.

The elastic retainer 4 is generally attached onto the moving arm 31 and includes an inner end 41 and an outer end 42, and also includes two blocking pieces 44, 45 protruded between the inner end 41 and the outer end 42. The inner end 41 of the elastic retainer 4 is secured onto the moving arm 31, and the outer end 42 is exposed out of the carrying tray 2. Accordingly, when the moving arm 31 is pushed inward, the blocking piece 44 is blocked by the inner surface of the heat dissipating board 24 (as shown in FIG. 5 and FIG. 7) in order to prevent the moving arm 31 to be pulled out in a reverse direction. When the moving arm 31 is pulled out, the blocking piece 45 is blocked by the outer surface of the heat dissipating board 24 (as shown in FIG. 8 and FIG. 9) in order to prevent the moving arm 31 from being pushed inward in a reverse direction.

Figure 3B:
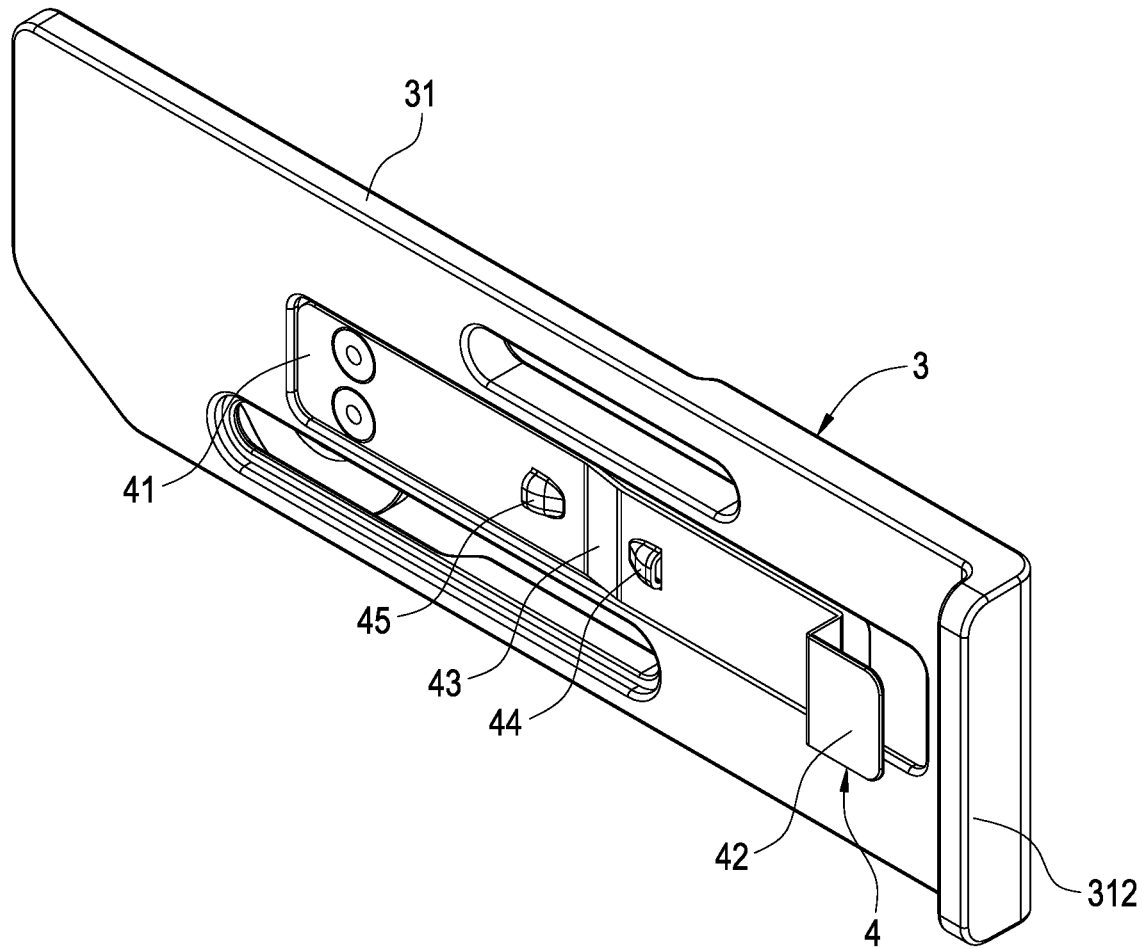

Preferably, as shown in FIG. 3B and FIG. 5, the elastic retainer 4 includes a bending portion 43 formed between the inner end 41 and the outer end 42. The two blocking pieces 44, 45 are respectively located at two sides of the bending portion 43 and corresponding to a move-in position and a move-out position of the first side board 21 respectively. In addition, a portion of the elastic retainer 4 between the inner end 41 and the bending portion 43 is attached onto the moving arm 31, and a portion of the elastic retainer 4 between the bending portion 43 and the outer end 42 is elastically cambered upward relative to the moving arm 31 via the bending portion 43.

As shown in FIG. 7, to disengage the blocking of the blocking pieces 44, 45 by the heat dissipating board 24, the outer end 42 is pressed to allow the elastic retainer 4 together with the blocking pieces 44, 45 to elastically deviate toward internal of the concave slot (not labeled with component sign) at one side of the moving arm 31, and after the deviation, the blocking pieces 44, 45 are able to disengage from the blocking by the heat dissipating board 24.

As shown in FIG. 2B and FIG. 9B, to provide a stable horizontal movement effect to the moving arm 31, a plurality of guiding tracks G can be arranged between the moving arm 31 and the first side board 21. The guiding track G includes a horizontal groove formed on the moving arm 31 and at least one attachment unit (not labeled with component sign). The two ends of the attachment unit are secured onto the moving arm 31 and the first side board 21 respectively. The portion of the attachment unit between the two ends thereof is movably inserted into the horizontal groove.

As shown in FIG. 2 and FIG. 7, to protect the aforementioned gear sector 32 and the gear rack 311. The first side board 21 can comprise a first side board main body 211 and a guard board 212 having the aforementioned sliding slot 322 formed thereon. The first side board main body 211 and the second side board 22 are arranged spaced apart from each other and installed vertically on the carrying board 23. An inner side of the guard board 212 covers onto the first side board main body 211 and a portion of the moving arm 31. Accordingly, the moving arm 31 is actually attached onto the inner side of the guard board 212, and the outer side of the guard board 212 is attached onto the first chassis plate 11. In addition, the gear sector 32 is clamped between the moving arm 31 and the guard board 212. Furthermore, the gear sector 32 is pivotally attached onto the guard board 212. Consequently, the gear sector 32 and the gear rack 311 can be protected by the guard board 212 in order to prevent the gear sector 32 and the gear rack 311 from movement or failure due to interference by or collision with other structures.

As shown in FIG. 1 to FIG. 9, according to the first exemplary embodiment of the present invention, when the chassis 1 includes a first horizontal protruding track 114 and a second horizontal protruding track 124 formed on an inner side of the first chassis plate 11 and the second chassis plate 12 respectively, then, the chassis 1 is divided into two insertion spaces (not labeled with component signs) arranged vertically and separated from each other in parallel by the first horizontal protruding track 114 and the second horizontal protruding track 124. The first chassis plate 1 includes two guiding slots 111 formed thereon corresponding to the two insertion spaces. Accordingly, the two carrying trays 2 are respectively accommodated inside the two insertion spaces and arranged vertically in parallel with each other, and the sliding columns 322 of the two operating structures 3 are inserted into the two guiding slots 111 respectively. Since the operating structure 3 adopts the horizontal push-pull method, consequently, despite that the two carrying trays 2 are arranged vertically in parallel with each other, when the operating structure 3 of one carrying tray 2 is operated, no interference on the other carrying 2 is not generated, making the server apparatus with a horizontal push-pull operating structure of the present invention particularly advantageous to the application of at least 2U type servers having at least two rack units (allowing two carrying trays 2 to be inserted into the chassis 1 vertically and parallel to each other). When the two carrying trays 2 are arranged vertically and parallel to each other, if the operating structure of a vertical operating method is used, it can cause interference with the other carrying tray 2 inserted on the top or the bottom; therefore, the present invention is particularly suitable to the application of at least 2U type servers.

Figure 10:
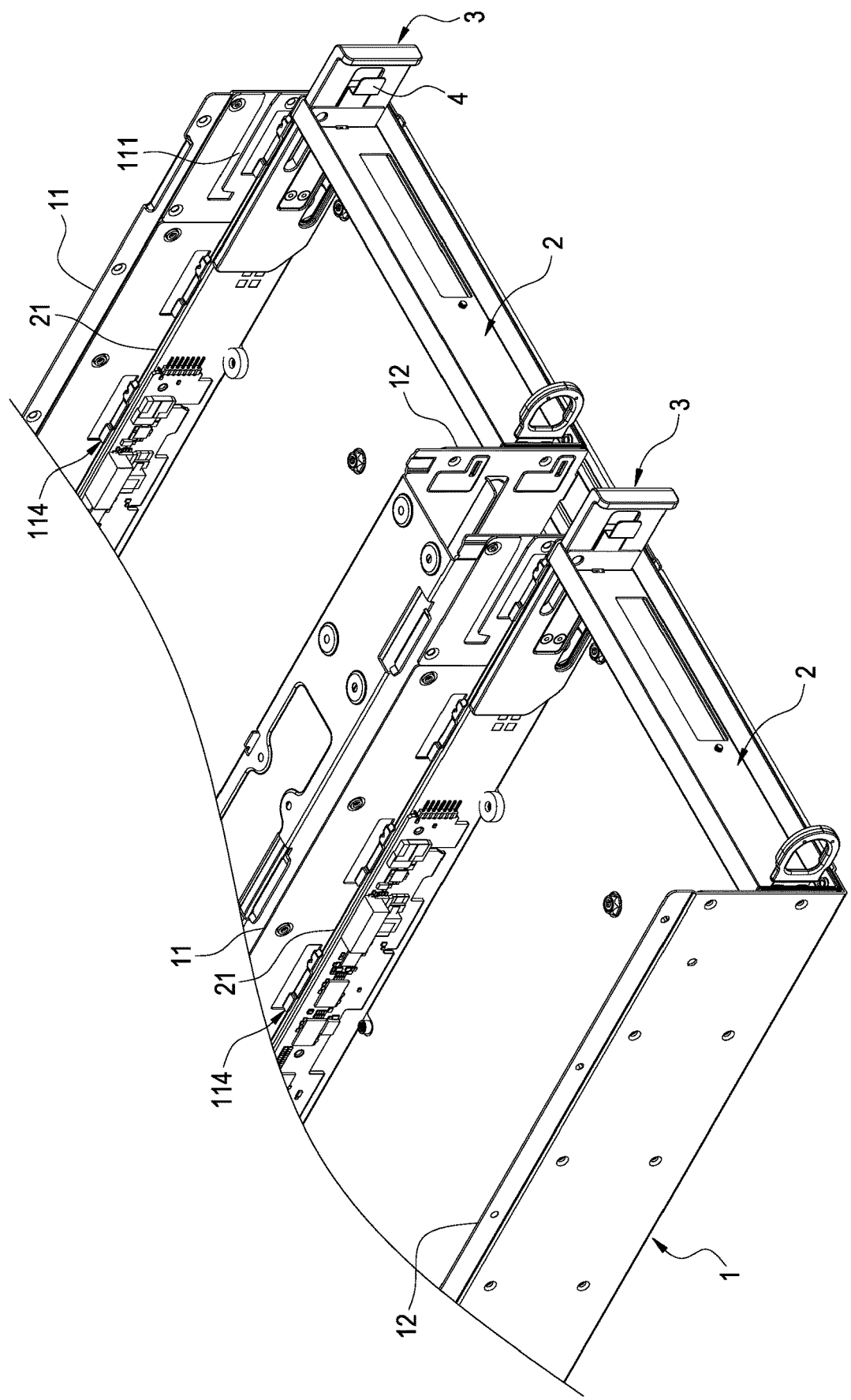
FIG. 10 is a perspective assembly view according to the second exemplary embodiment of the present invention.

Please refer to FIG. 10, showing a second exemplary embodiment of the present invention. The second exemplary embodiment is generally the same as the first exemplary embodiment, and the difference mainly relies in a plurality of first chassis plates 11 and a plurality of second chassis plates 12. Each first chassis plate 11 and each second chassis plate 12 are spaced apart from each other and vertically installed on the aforementioned base plate 13 respectively in order to form two insertion spaces (not labeled with component signs) at left and right sides respectively and parallel to each other. However, as shown in the drawing, since each first chassis plate 11 and each second chassis plate 12 also include the first horizontal protruding track 114 and the second horizontal protruding track 124 (as shown in FIG. 1), the chassis 1 is further formed into two insertion spaces arranged in both vertically and horizontally in parallel with each other.

In view of the above, the server apparatus with a horizontal push-pull operating structure of the present invention is a novel design capable of achieving the objectives of the present invention and overcoming the drawbacks of known arts. The present invention is novel and of inventive step, which satisfies the patentability requirements.

The above describes the preferable and feasible exemplary embodiments of the present invention for illustrative purposes only, which shall not be treated as limitations of the scope of the present invention. Any equivalent changes and modifications made in accordance with the scope of the claims of the present invention shall be considered to be within the scope of the claim of the present invention.

What is claimed is:
1. A server apparatus with a horizontal push-pull operating structure, comprising:
    a chassis comprising a base plate and a first chassis plate and a second chassis plate arranged spaced apart from each other and installed vertically on the base plate, and the first chassis plate having a guiding slot formed thereon;

a carrying tray carried on the base plate and inserted between the first chassis plate and the second chassis plate, the carrying tray comprising a carrying board and a first side board and a second side board arranged spaced apart from each other and installed vertically on the carrying board, the first side board attached onto the first chassis plate and having a sliding slot formed corresponding to the guiding slot; and an operating structure comprising a moving arm and a gear sector, the moving arm attached onto the first side board and having a gear rack, the gear sector clamped between the moving arm and the first side board and having an addendum and a sliding column, the gear sector pivotally attached onto the first side board, the addendum engaged with the gear rack, the sliding column inserted into the sliding slot and the guiding slot;

wherein when the moving arm together with the gear rack are horizontally pushed or pulled relative to the first side board selectively, the gear rack drives the gear sector to rotate, and the sliding column moves inside the sliding slot along with the gear sector and also drives the first side board to move due to guidance provided by the guiding slot, and respectively allowing the carrying tray to move into the base plate or move out of the base plate.

2. The server apparatus with a horizontal push-pull operating structure according to claim 1, further comprising an elastic retainer, the elastic retainer having an inner end and an outer end and having two blocking pieces protruded between the inner end and the outer end; the carrying tray includes an insertion slit, and the moving arm is moveably inserted into the insertion slit; the inner end of the elastic retainer is secured onto the moving arm, the outer end of the elastic retainer is exposed out of the carrying tray; any one of the blocking pieces is blocked by the carrying tray; the elastic retainer is operated to allow the outer end to disengage a blocking state of the blocking piece by the carrying tray.

3. The server apparatus with a horizontal push-pull operating structure according to claim 2, wherein the carrying tray further comprises a heat dissipating board; the heat dissipating board is connected between the first side board and the second side board and jointly circumferencing the carrying board; the insertion slit is formed at an attachment area between the heat dissipating board and the first side board; any one of the blocking pieces is blocked by the heat dissipating board, the elastic retainer is pressed at the outer end to disengage a blocking state of the blocking piece by the heat dissipating board.

4. The server apparatus with a horizontal push-pull operating structure according to claim 2, wherein the elastic retainer includes a bending portion formed between the inner end and the outer end; the two blocking pieces are respectively located at two sides of the bending portion and corresponding to a move-in position and a move-out position of the first side board along with the carrying tray respectively; a portion of the elastic retainer between the inner end and the bending portion is attached onto the moving arm, and a portion of the elastic retainer between the bending portion and the outer end is elastically cambered upward relative to the moving arm.

5. The server apparatus with a horizontal push-pull operating structure according to claim 1, wherein the gear sector includes a pivotal hole; the pivotal hole is located between the addendum and the sliding column; a distance between the addendum and the pivotal hole is greater than a distance between the pivotal hole and the sliding column.

6. The server apparatus with a horizontal push-pull operating structure according to claim 1, wherein one end of the moving arm protrudes out of the carrying tray to form a holding section; the holding section protrudes out of the carrying tray when the carrying tray moves in and moves out of the base plate along with the first side board.

7. The server apparatus with a horizontal push-pull operating structure according to claim 1, wherein the first side board comprises a first side board main body and a guard board having the sliding slot formed thereon; the first side board main body and the second side board are arranged spaced apart from each other and installed vertically on the carrying board; one side of the guard board covers onto the first side board main body and a portion of the moving arm, and the moving arm is attached onto one side of the guard board, another side of the guard board is attached onto the first chassis plate; the gear sector is clamped between the moving arm and the guard board, the gear sector is pivotally attached onto the guard board, the gear sector and the gear rack are protected by the guard board.

8. The server apparatus with a horizontal push-pull operating structure according to claim 1, wherein the sliding slot comprises a first end adjacent to the base plate and a second end opposite therefrom; the guiding slot comprises a horizontal section and a vertical section connected to each other; the vertical section is stacked onto the first end of the sliding slot.

9. The server apparatus with a horizontal push-pull operating structure according to claim 1, wherein the carrying tray and the operating structure are configured to be of two units respectively; each operating structure is installed on each carrying tray, an inner side of each of the first chassis plate and the second chassis plate are respectively formed of a first horizontal protruding track and a second horizontal protruding track, the chassis is divided into two insertion spaces arranged vertically by the first horizontal protruding track and the second horizontal protruding track; the first chassis plate includes two guiding slots formed thereon corresponding to the two insertion spaces; each carrying tray is respectively accommodated inside each insertion space, and the sliding column of each operating structure is inserted into each guiding slot respectively.

10. The server apparatus with a horizontal push-pull operating structure according to claim 1, wherein the carrying tray and the operating structure are configured to be of a plurality of units respectively; each operating structure is installed on each carrying tray, the chassis includes a plurality of the first chassis plates and a plurality of the second chassis plates, each first chassis plate and the second chassis plate are arranged spaced apart from each other and installed vertically on the base plate in order to form two insertion spaces at left and right sides respectively and parallel to each other; each carrying tray is accommodated inside each insertion space respectively.

* * * * *